(12) United States Patent
Torsner et al.

(10) Patent No.: US 7,783,730 B2
(45) Date of Patent: Aug. 24, 2010

(54) SIGNALLING OPTIMISATIONS USING HASH FUNCTIONS

(75) Inventors: Per Johan Torsner, Masaby (FI); Mats Sågfors, Kyrkslätt (FI)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 96 days.

(21) Appl. No.: 12/089,096

(22) PCT Filed: Jun. 30, 2006

(86) PCT No.: PCT/EP2006/006374

§ 371 (c)(1),
(2), (4) Date: Nov. 17, 2008

(87) PCT Pub. No.: WO2007/038999

PCT Pub. Date: Apr. 12, 2007

(65) Prior Publication Data

US 2009/0222524 A1    Sep. 3, 2009

(51) Int. Cl.
*G06F 15/16* (2006.01)
*G06F 12/00* (2006.01)

(52) U.S. Cl. ...................... 709/220; 709/221
(58) Field of Classification Search ......... 709/220–221, 709/206–207, 223–229, 250

See application file for complete search history.

(56) References Cited

U.S. PATENT DOCUMENTS

| | | | |
|---|---|---|---|
| 7,603,464 B2* | 10/2009 | White | 709/226 |
| 2003/0163683 A1* | 8/2003 | Xu et al. | 713/153 |
| 2004/0044727 A1* | 3/2004 | Abdelaziz et al. | 709/203 |
| 2004/0064568 A1* | 4/2004 | Arora et al. | 709/228 |
| 2004/0064693 A1* | 4/2004 | Pabla et al. | 713/168 |

* cited by examiner

*Primary Examiner*—Zarni Maung
(74) *Attorney, Agent, or Firm*—Thomas Bethea, Jr.

(57) ABSTRACT

A method for configuring a connection between first and second peer entities in a wireless telecommunications network comprises sending a hash value between the first and second peer entities, the hash value being a compact representation of information relating to a connection configuration procedure between the first and second peer entities.

6 Claims, 6 Drawing Sheets

SIGNALLING OPTIMISATIONS USING HASH FUNCTIONS

The present invention relates to wireless telecommunications systems.

BACKGROUND OF THE INVENTION

In current Universal Mobile Telecommunications System (UMTS) networks, as well as in many other wireless systems, connection configuration time is significant. This is partly due to the fact that large amounts of data are sent as set up messages between user equipment (UE) and network resources.

FIG. 1 illustrates a telecommunications network in which network resources 2 communicate with user equipment 4 via an air interface 6. The network resources 2 include an antenna 21, and the user equipment 4 includes an antenna 41. The network resources 2 and the user equipment 4 communicate in conventional manner via the antenna 21 and 41 via the air interface 6. In order for communication to occur between the network resources 2 and the user equipment 4, it is necessary to set up a connection therebetween.

A typical signalling sequence for establishing a connection between the user equipment and the network resources in a UMTS network is illustrated in FIG. 2 of the accompanying drawings.

As can be seen from FIG. 2, a series of messages are transferred between the user equipment and network resources, and messages are typically initiated by the user equipment wishing to set up a connection with the network resources concerned. As an alternative, the network resources can initiate the connection configuration procedure.

The conventional connection set up technique described uses many messages, and hence a large amount of data needed to be transferred between the user equipment and the network resources. Thus, the time taken for the connection to be set up can be relatively long. It is therefore desirable to provide a technique which can reduce the amount of time taken for connection set up.

SUMMARY OF THE PRESENT INVENTION

In an embodiment of one aspect of the present invention, when setting up a connection between first and second peer entities connection configuration information is condensed into a hash value. By exchanging the hash value, the network resources and the UE can identify whether or not the information is available in both the UE and network resources. The method can reduce the size of the transmitted messages considerably and in some cases a message (or group of messages) may be omitted completely. The hash value can relate to information stored in a particular connection configuration message, with a return hash value relating to response information. Alternatively, the hash value may be a compact representation of at least part of a connection configuration.

A plurality of hash values can be transferred between the first and second peer entities, in place of the usual configuration messages.

According to a first aspect of the present invention, there is provided a method for configuring a connection between first and second peer entities in a wireless telecommunications network, the method comprising sending a hash value between the first and second peer entities, the hash value being a compact representation of information relating to a connection configuration procedure between the first and second peer entities.

According to another aspect of the present invention, there is provided a wireless telecommunications network comprising a connection configuration unit operable to send a hash value between first and second peer entities, the hash value being a compact representation of information relating to a connection configuration procedure between the first and second peer entities.

According to another aspect of the present invention, there is provided a mobile terminal operable to communicate with a wireless telecommunications network, the mobile terminal comprising a connection configuration unit operable to send a hash value to network resources of a telecommunications network, the hash value being a compact representation of information relating to a connection configuration procedure between the mobile terminal and the network resources.

Embodiments of the invention thus serve to minimise the message sizes and number of transmitted messages by using hash values. A hash value is a compact representation of the information in a message, e.g. a cyclic redundancy check (CRC) or an integrity protection checksum.

Accordingly, such a system can increase the speed of connection configuration, by reducing the amount of data to be transferred between the network resources and the user equipment.

DETAILED DESCRIPTION OF THE PREFERRED EMBODIMENTS

In the following, different alternatives for using the hash values to optimise signalling delay are described. The alternatives can be combined so that different alternatives are used for different messages in a sequence, or even different alternatives for different information elements in the messages.

Figure 1:
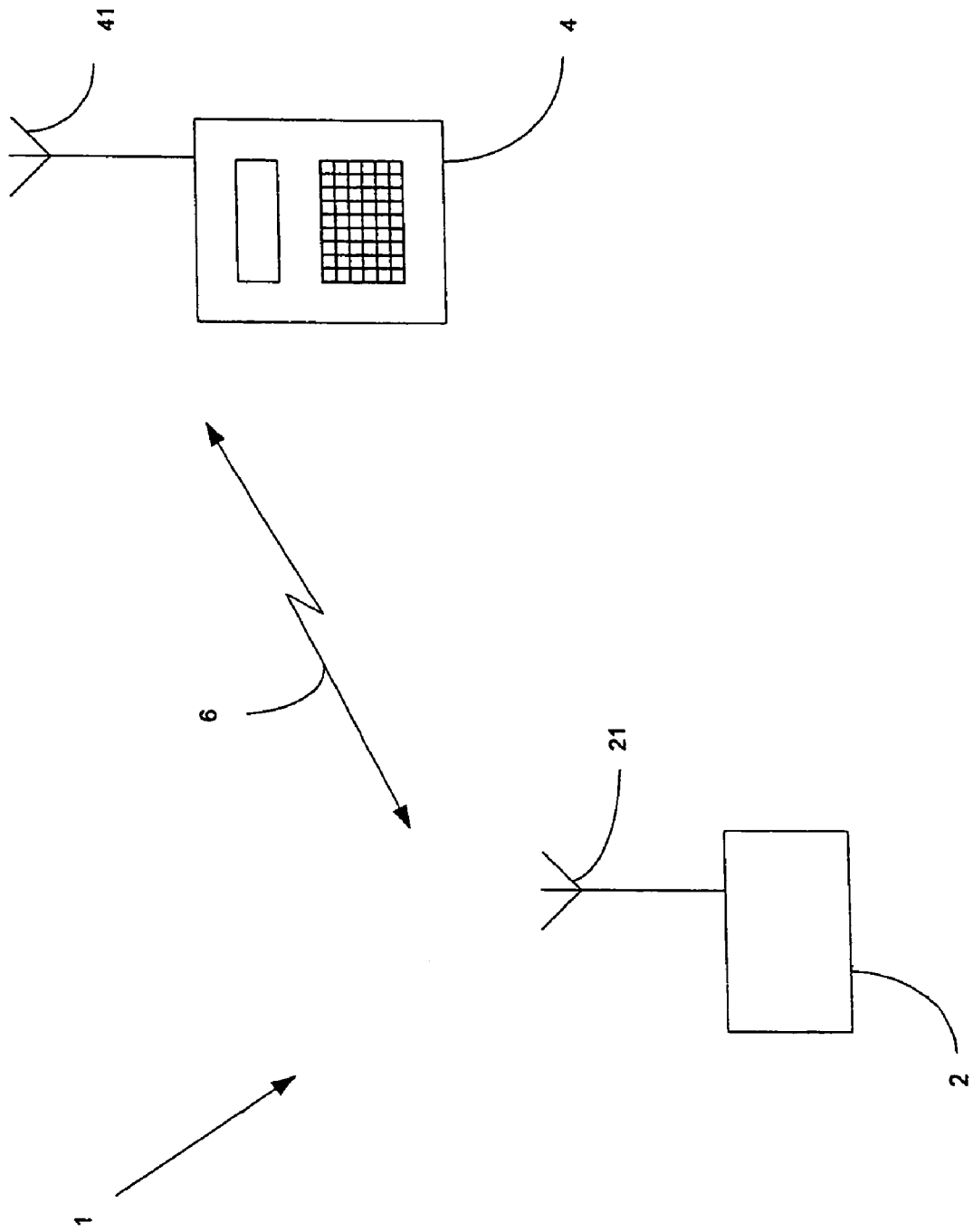
FIG. 1 illustrates a wireless telecommunication network.
Figure 2:
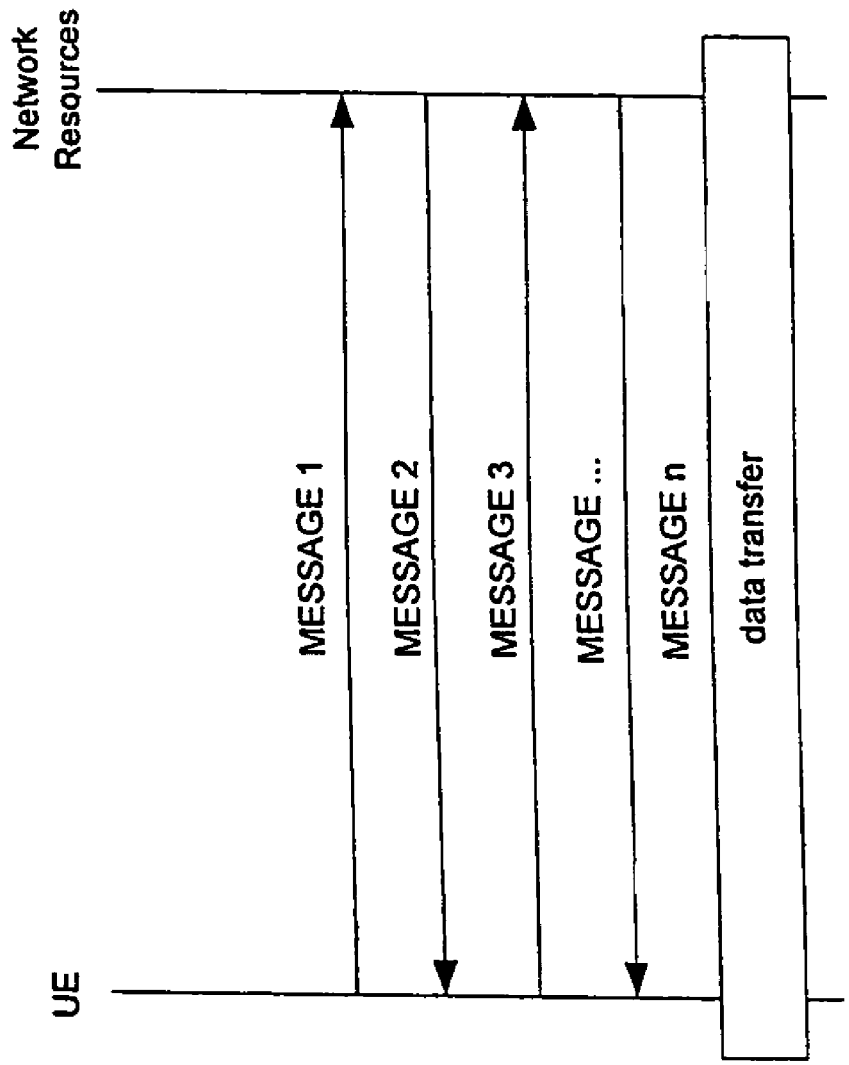
FIG. 2 illustrates connection configuration in a wireless telecommunications network.
Figure 3:
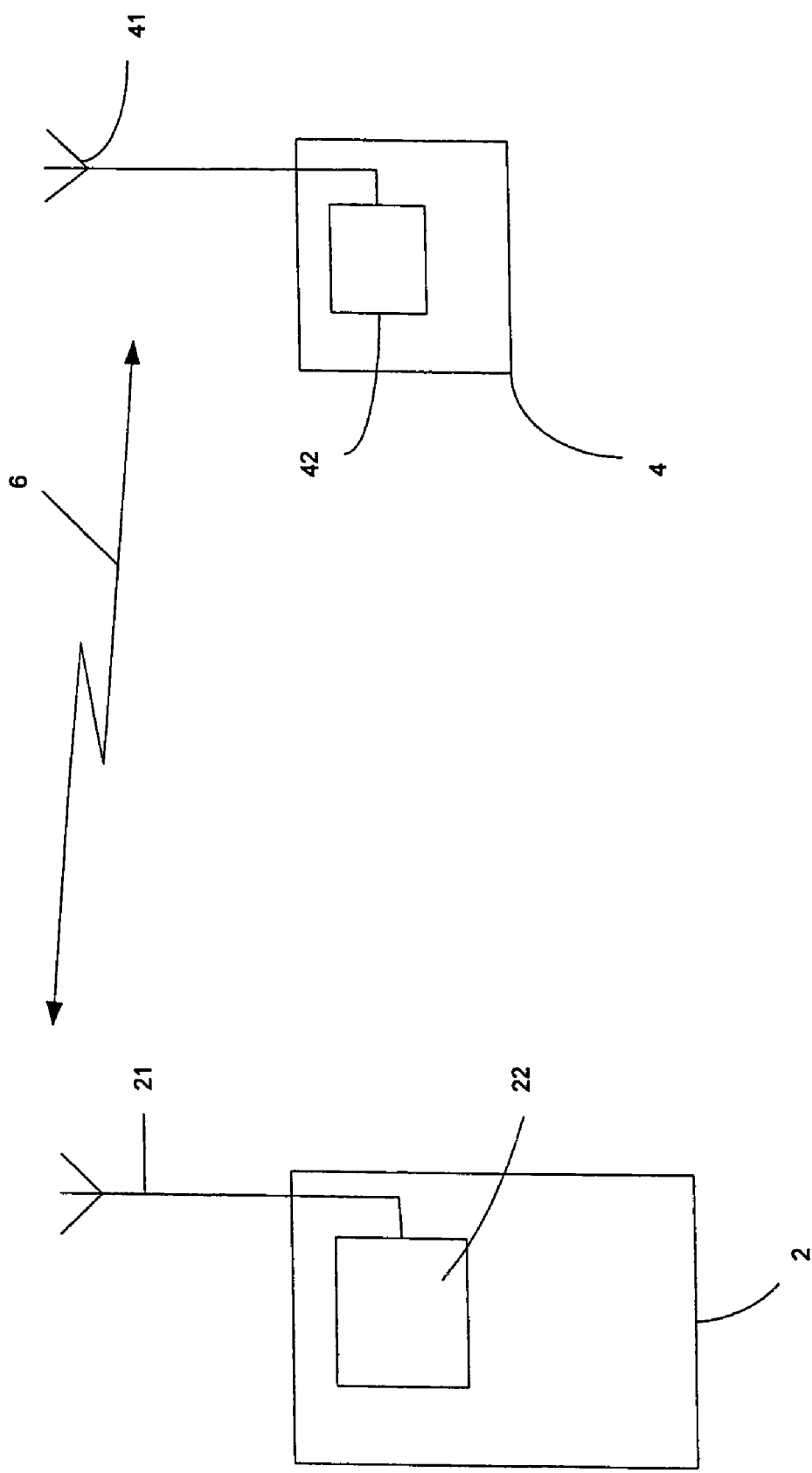
FIG. 3 illustrates a wireless telecommunications network embodying one aspect of the present invention.

FIG. 3 illustrates a telecommunications system embodying one aspect of the present invention. The system comprises network resources 2 which communicate with user equipment 4 via an air interface 6, as before. The network resources 2 include an antenna 21 connected to a controller 22. The controller 22 serves to transmit and receive data using the antenna 21, and to provide the services and functions of the network resources 2. The user equipment 4 includes a controller 42, which serves to handle communications to and from the antenna 41 of the user equipment 4.

As described above, in order for user equipment 4 to communicate with the network resources 2, it is necessary to set up a connection between the two.

Figure 4:
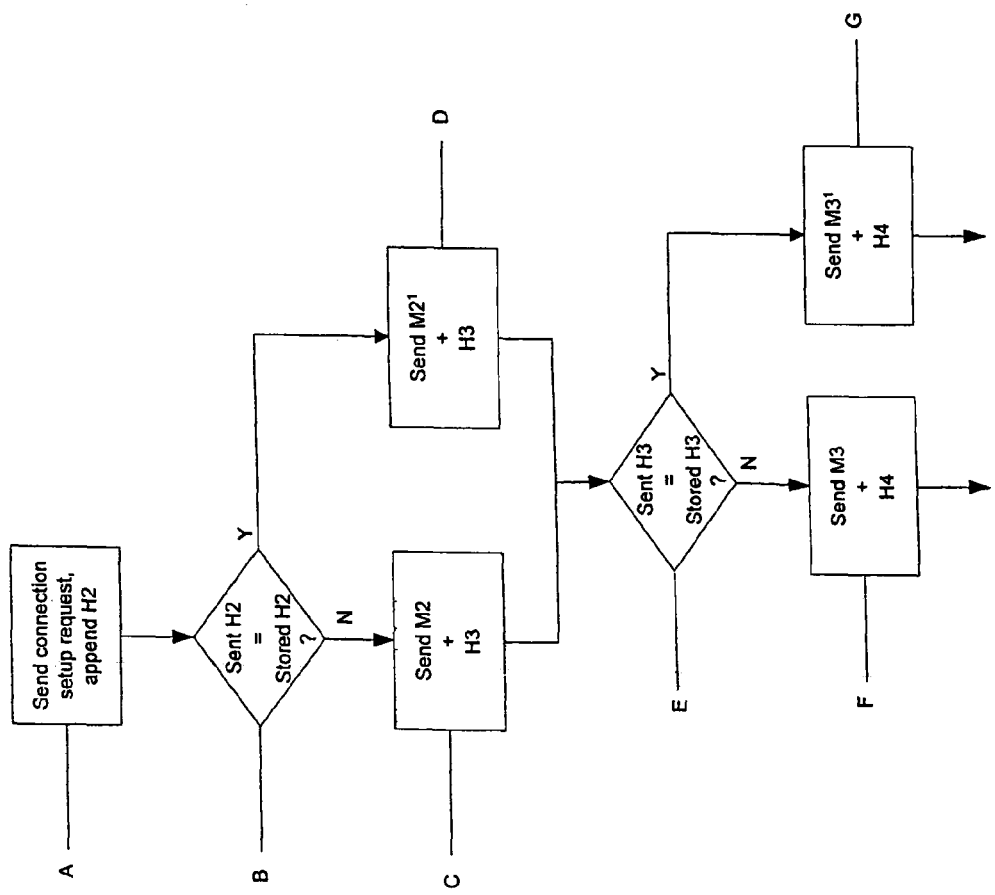
FIG. 4 is a flowchart illustrating a first method embodying another aspect of the present invention.

FIG. 4 illustrates steps in a first method embodying the present invention. This embodiment will be described with reference to FIGS. 3 and 4. In this embodiment, the UE 4 and the network resources 2 calculate and store hash values $H1 \ldots HN$ for each message $k=1 \ldots N$ in the configuration sequence, during the initial connection configuration procedure.

In the following description, the UE 4 is considered to be a first peer entity that initiates the connection configuration procedure, and the network resources 2 are the second peer entity with which the first peer entity communicates. However, it will be readily appreciated that the network resources could initiate the connection configuration, and be considered the first peer entity, with the UE 4 being the second peer entity.

The subsequent connection configuration commences at step A when the UE 4 sends a configuration message M1 to the network resources 2. Appended to message M1 is the stored hash value H2 for the expected response message (message M2). The network resources 2 compare (step B) the received hash value H2 with the stored hash value for the message (M2) it intends to send in response. If the stored and received hash values are identical, the network resources 2 know that the UE 4 already has the available information in message M2. Thus, it is not necessary to send the complete message M2. Instead, the network resources indicate that the UE 4 should use the stored configuration, by sending (step D) a very short indication message M2'. To that message M2', the network resources 2 append the stored hash-value H3 for message M3. If the stored and received values of H2 are not identical, the complete message M2 is sent (step C) from the network resources 2 to the user equipment 4, with the hash value H3 appended thereto.

The network resources 2 and user equipment 4 then repeat these steps for the subsequent messages in the connection configuration procedure. Steps E, F and G illustrate the process for the third message M3.

If the whole message sequence is identical to the previous signalling sequence, all messages except the first will only contain hash values and an indication that stored information is valid. If any information in the signalling sequence is different from the previous sequence, then the appropriate message Mn, containing that information, is sent explicitly when the hash values do not match.

In a variation to this method, instead of appending the hash value for the expected response message to a transmitted message, the hash values of several expected messages from the peer entity (network resources 2 or UE 4) are appended to a single message.

For example, for message M1, the UE 4 appends hash values for messages 2,4,6 . . . etc. For the response message M2: the network resources append the hash values for messages 3,5,7 . . . etc. If the sequence of messages has identical content to the previous sequence, the whole configuration sequence would only consist of two messages M1 and M2. Using this technique, only the first message from each of the network resources 2 and the user equipment 4, together with any changes messages, are transferred.

Figure 5:
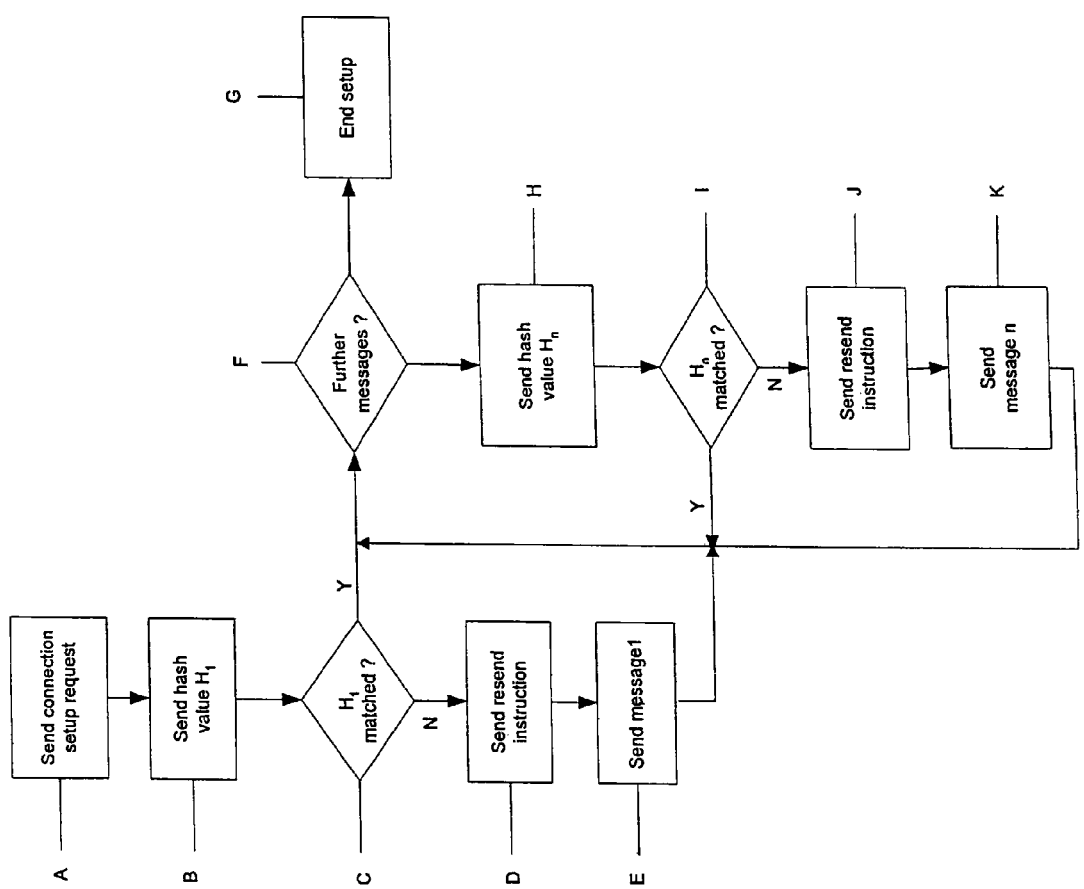
FIG. 5 is a flowchart illustrating a second method embodying another aspect of the present invention.

FIG. 5 is a flowchart illustrating steps in a second method embodying another aspect of the present invention. This method will be described with reference to FIGS. 3 and 5. The method is again concerned with setting up a connection between user equipment 4 and the network resources 2 subsequent to the first connection set up between the two devices. This subsequent connection configuration is the case for the vast majority of user equipment in a network, since it is uncommon for a user equipment to roam outside of the network concerned.

Once again, the UE 4 is described as initiating the connection configuration procedure, but the network resources 2 could alternatively initiate the procedure.

At step A, the user equipment 4 sends a connection configuration request via the air interface 6 to the network resources 2. The network resources 2 must then respond to the user equipment 4 by sending a message M1. However, in this embodiment, a hash value H1, which is related to the message M1, is sent. As mentioned above, a hash value is a compact representation of the information in the message, for example, a cyclic redundancy check or an integrity protection check sum. Hash values are very much shorter than the corresponding message, and so the sending of the hash value H1 is much more efficient than sending the whole message M1. The receiving device, in this case the user equipment 4, checks to determine whether the hash value for the expected message matches the hash value for that same message as received during the last connection configuration (step C). If this is not the case, that is that the message M1 has changed, then the user equipment 4 sends a resend instruction (step D) to the network resources 2 in order to prompt the network resources to send message M1 completely (step E).

If further messages are not required (step F) then the connection configuration is considered complete (step G). However, for all further messages, the hash value for the message concerned MN. If the hash value HN matches the hash value corresponding to the previously received message N (step I) then the connection configuration continues with further messages. However, if the hash value HN does not match that as already received, then a resend instruction is sent from the receiving device (step J) so that the transmitting device can send message N in complete form (step K). It will therefore be appreciated that, in this embodiment of the present invention, only those messages which have changed are sent in complete form, and the technique does not send messages between the user equipment 4 and the network resources 2 which have not changed since the last time the messages were sent.

In a first embodiment, the sending of hash values H, . . . Hn is applied to the whole connection configuration sequence. In an alternative embodiment, hash values can be used for selected messages that have a high likelihood of being unchanged between different sequences in the same network.

In this second embodiment, the hash values are used in an opportunistic way, i.e. it is assumed that the receiver already has the information in the message as described above. In this case only the hash value of the message is transmitted instead of the whole message. When the peer entity receives the hash value for a message k it compares it with its stored hash value for that message. If the hash values match, the receiving entity will just continue with the signalling sequence and the transmission of the next message in the sequence will serve as an indication of that the information was indeed available in the entity. If the hash value in the receiving entity does not match the received hash value, a failure indication is sent to request the transmission of the complete message.

It can be seen that when the messages are identical (i.e. the hash values are identical) the signalling will be faster than using complete messages. If, however, the operation is not successful, the full message must be transferred, and so the total delay can be larger than a normal signalling sequence. The method should, therefore, ideally only be used if the probability is high that the message information is already available in the peer entity.

Figure 6:
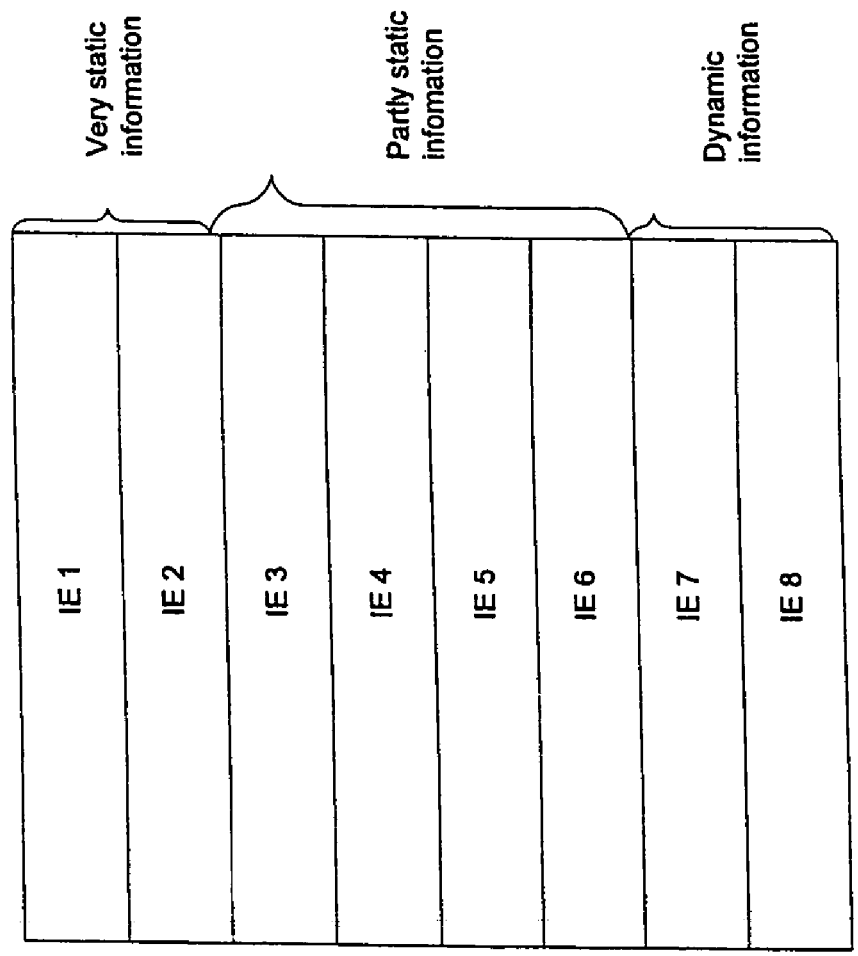
FIG. 6 illustrates connection configuration messages.

FIG. 6 illustrates messages to be sent in a connection configuration technique, which, in this example, contains 8 information elements IE1 to IE2. An information element is a parameter or a group of parameters referring to a related functionality.

The information in the message can be grouped according to how often the information changes. "Very static" information (IE1, IE2) is information that very likely remains the same for every connection configuration, i.e. parameters that are network implementation dependent. Partly static information (IE3 to IE6) is that which may change, but is likely to be the same in consecutive connection configurations. Finally, dynamic information (IE7, IE8) contains parameters that change frequently.

The method described above can therefore be selectively applied to different information elements (messages).

For example the dynamic information (IE 7-8) can always be sent explicitly, whereas the static and partly static information (E 1-6) can be indicated through hash values using a technique as described above.

In another embodiment of the present invention, the hash values sent between the first and second peer entities represent particular connection configurations, rather than the information stored in the messages as such. Acknowledgment hash values can then relate to the configuration. Such an embodiment operates in accordance with methods described above, with the difference that the hash values are representative of connection configurations or acknowledgements.

In another embodiment, the first and second peer entities store pluralities of hash values relating to different configurations and responses. In dependence upon the connection requirements, different hash values and responses may be transferred between the peer entities.

With embodiments of the invention, it is possible to reduce signalling delays of configuration data that tend to be quite static. In particular, the method in the invention can significantly reduce the channel setup times in wireless systems.

A particular example is the case of a UE, which camps in its "own" network most of the time. In such cases, the exchange of information between the UE and the network can be reduced significantly—still without "hard-coding" the configuration. In case the same UE visits a different network through roaming (or if the operator decides to reconfigure certain semi-static parameters), then the first configuration may take slightly longer (similar to the case today), but subsequent configuration delays will be low again.

The invention claimed is:

1. A method for configuring a connection between first and second peer entities in a wireless telecommunications network, the method comprising;
    sending a hash value between the first and second peer entities, the hash value being a compact representation of information relating to a connection configuration procedure between the first and second peer entities;
    transferring a series of connection configuration messages between the first and second peer entities;
    storing respective hash values relating to each of the configuration messages in the series of configuration messages;
    transferring a first configuration message from the first peer entity to the second peer entity;
    transferring a hash value relating to a second configuration message in the series from the first peer entity to the second peer entity;
    if the hash value relating to the second configuration message matches a hash value for that message stored at the second peer entity:
    transferring a shortened validation message for the second configuration message in the series from the second peer entity to the first peer entity, and
    transferring a hash value for the third configuration message in the series from the second peer entity to the first peer entity; or
    if the hash value relating to the second configuration message does not match a hash value for that configuration message stored at the second peer entity:
    transferring the second configuration message from the second peer entity to the first peer entity, and transferring, a hash value for the third configuration message in the series from the second peer entity to the first peer entity.

2. A method for configuring a connection between first and second peer entities in a wireless telecommunications network, the method comprising:
    sending a hash value between the first and second peer entities, the hash value being a compact representation of information relating to a connection configuration procedure between the first and second peer entities;
    transferring a series of connection configuration messages between the first and second peer entities;
    storing respective hash values relating to each of the configuration messages in the series of configuration messages at each of the first and second peer entities, and,
    for each configuration message in the series of configuration messages, transferring a hash value relating to that configuration message between the first and second peer entities, and,
    if a transferred hash value does not match a corresponding stored hash value, transferring the configuration message relating to that hash value.

3. A method as claimed in claim 2, wherein the configuration message is transferred in response to transfer of a failure message.

4. A method for configuring a connection between first and second peer entities in a wireless telecommunications network, the method comprising:
    sending a hash value between the first and second peer entities, the hash value being a compact representation of information relating to a connection configuration procedure between the first and second peer entities;
    transferring a series of connection configuration messages between the first and second peer entities;
    sending a hash value relating to a configuration message from the first peer entity to the second peer entity; and receiving a shortened validation message at the first peer entity from the second peer entity, if the hash value matches a hash value stored at the second peer entity; or
    receiving a failure message at the first peer entity from the second peer entity, if the hash value does not match a hash value stored at the second peer entity, and, in response to receiving a failure message, sending the configuration message from the first peer entity to the second peer entity.

5. A method for configuring a connection between first and second peer entities in a wireless telecommunications network, the method comprising:
    sending a hash value between the first and second peer entities, the hash value being a compact representation of information relating to a connection configuration procedure between the first and second peer entities;
    transferring a series of connection configuration messages between the first and second peer entities;
    receiving a hash value relating to a configuration message from the first peer entity at the second peer entity; and sending a shortened validation message to the first peer entity from the second peer entity, if the hash value matches a hash value stored at the second peer entity; or
    sending a failure message to the first peer entity from the second peer entity, if the hash value does not match a hash value stored at the second peer entity, and, in response to sending a failure message, receiving the configuration message from the first peer entity at the second peer entity.

6. A method for configuring a connection between first and second peer entities in a wireless telecommunications network, the method comprising:

sending a hash value between the first and second peer entities, the hash value being a compact representation of information relating to a connection configuration procedure between the first and second peer entities;

transferring a series of connection configuration messages between the first and second peer entities;

sending a first configuration message from the first peer entity to the second peer entity;

sending to the second peer entity, hash values relating to all of the configuration messages to be transferred from the first peer entity to the second peer entity;

comparing the hash values with stored hash values;

sending an indication of the result of the comparison to the first peer entity;

sending configuration messages from the first peer entity to the second peer entity which configuration messages correspond to those hash values that do not match stored hash values.

* * * * *

UNITED STATES PATENT AND TRADEMARK OFFICE
CERTIFICATE OF CORRECTION

PATENT NO. : 7,783,730 B2
APPLICATION NO. : 12/089096
DATED : August 24, 2010
INVENTOR(S) : Torsner et al.

It is certified that error appears in the above-identified patent and that said Letters Patent is hereby corrected as shown below:

On the Cover Page, in Column 1, below "Prior Publication Data" insert item
-- (30) Foreign Application Priority Data   Oct. 3, 2005   (EP) ................ 05256170 --.

In Column 5, Line 8, delete "(E 1-6)" and insert -- (IE 1-6) --, therefor.

In Column 5, Line 39, in Claim 1, delete "comprising;" and insert -- comprising: --, therefor.

Signed and Sealed this
Fifth Day of April, 2011

David J. Kappos
*Director of the United States Patent and Trademark Office*